United States Patent [19]

Nagaraj

[11] Patent Number: 5,212,486
[45] Date of Patent: May 18, 1993

[54] CYCLIC ANALOG-TO-DIGITAL CONVERTER

[75] Inventor: Krishnaswamy Nagaraj, Macungie, Pa.

[73] Assignee: AT&T Bell Laboratories, Murray Hill, N.J.

[21] Appl. No.: 814,339

[22] Filed: Dec. 26, 1991

[51] Int. Cl.⁵ .................. H03M 1/40; H03M 1/50; H03M 1/12
[52] U.S. Cl. .................. 341/172; 341/122; 341/163; 341/158; 341/165
[58] Field of Search .............. 341/172, 163, 162, 161, 341/155, 158, 164, 165

[56] References Cited

U.S. PATENT DOCUMENTS

| | | | |
|---|---|---|---|
| 4,529,965 | 7/1985 | Lee | 340/347 |
| 4,743,885 | 5/1988 | Kobayashi et al. | 341/163 X |
| 4,760,376 | 7/1988 | Kobayashi et al. | 341/172 |
| 5,017,920 | 5/1991 | French | 341/163 |
| 5,027,116 | 6/1991 | Armstrong et al. | 341/120 |
| 5,107,266 | 4/1992 | Kim | 341/163 |

OTHER PUBLICATIONS

"An Algorithmic Analog-to-Digital Converter", by R. H. McCharles et al, IEEE International Solid-State Circuits Conference Digest of Technical Papers (1977), pp. 96-97.

*Primary Examiner*—Sharon D. Logan
*Attorney, Agent, or Firm*—Geoffrey D. Green

[57] ABSTRACT

A cyclic analog-to-digital converter includes two arithmetic circuits and a single comparator. The output of each arithmetic circuit is connected to the input of the other arithmetic circuit. Each arithmetic circuit can modify the analog signal being converted in accordance with output signals from the comparator. Embodiments are disclosed in which the arithmetic circuits include switched capacitors and separate or shared operational amplifiers.

5 Claims, 3 Drawing Sheets

CYCLIC ANALOG-TO-DIGITAL CONVERTER

FIELD OF THE INVENTION

This invention relates to analog-to-digital ("A/D") converters, and more particularly to cyclic or algorithmic A/D converters implemented with switched-capacitance circuits.

BACKGROUND OF THE INVENTION

A/D converters are widely used in many applications. Cyclic or algorithmic A/D converters, in which an analog signal to be converted is cycled serially through analog arithmetic and comparator circuits, are useful in applications requiring small circuit size and power drain, but are somewhat slower than alternatives such as "flash" converters or "pipeline" converters that can perform conversion steps in parallel. A prior-art algorithmic A/D converter using switched-capacitance techniques is described in McCharles et al., "An Algorithmic Analog-to-Digital Converter," IEEE International Solid-State Circuits Conference Digest of Technical Papers (1977), pp 96–97. A similar A/D converter in which a multiply-by-two function is achieved by addition is disclosed in U.S. Pat. No. 4,529,965.

Algorithmic A/D converters typically operate by sequentially comparing an analog signal with a reference, multiplying the signal by a constant (usually 2), subtracting a value from the result of the multiplication depending on the result of the comparison and repeating the comparison, multiplication and subtraction sequence until the required number of binary digits ("bits") is obtained. In some converters the multiplication and subtraction steps are interchanged. Each cycle generates one bit of the digital representation of the analog signal being converted. The prior art converters referred to above include an arithmetic circuit to perform the subtraction and multiplication and a sample-and-hold circuit to store the analog residue from the preceding cycle.

In a fast A/D converter the comparator may not have time to completely settle before its output is used. For this reason, and also because the inputs to the comparator may be very close in value, the output of the comparator can be in error. Improvements employing multi-level comparators and digital correction to compensate for errors thus made are known in the art, for example, as disclosed in U. S. Pat. No. 5,017,920.

The need is for fast, accurate A/D converters that can be implemented with a minimum of circuitry, thus requiring less area on a semiconductor chip and less operating power.

SUMMARY OF THE INVENTION

A cyclic or algorithmic A/D converter is disclosed in which conversion cycles are overlapped to speed up conversion time. To accomplish this result, the sample-and-hold circuit used in prior-art converters is replaced with a second arithmetic circuit. Embodiments are disclosed using switched capacitors and either one or two operational amplifiers. Another embodiment is disclosed for use with digital correction logic.

DETAILED DESCRIPTION

Figure 1:
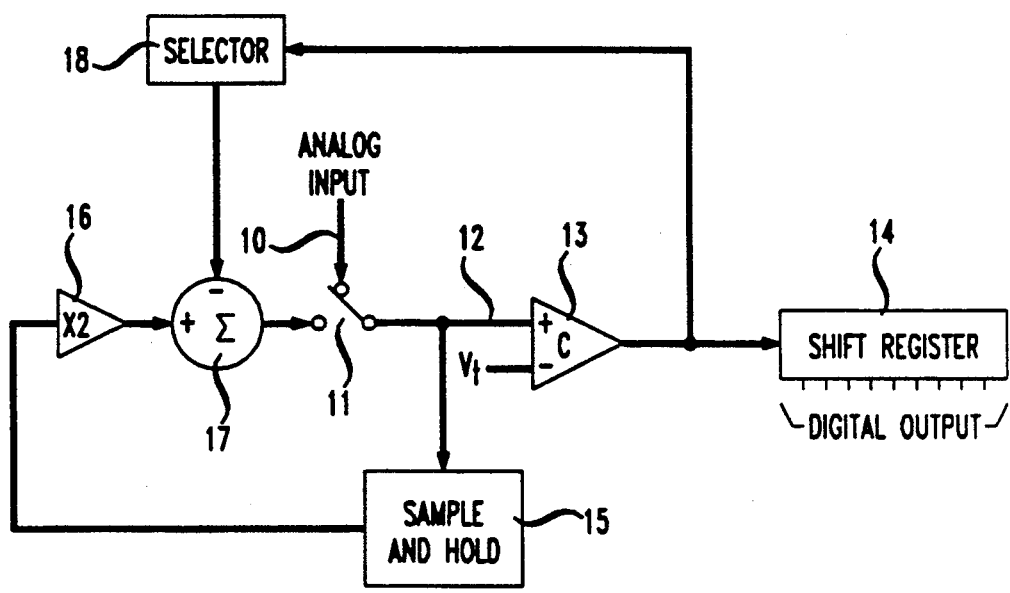
FIG. 1 is a block diagram of a prior-art algorithmic A/D converter.

In the exemplary prior-art A/D algorithmic converter shown in FIG. 1, an analog input signal to be converted is applied to lead 10 and passes through switch 11 and via lead 12 to the positive terminal of comparator 13 and to the input of sample-and-hold circuit 15. Comparator 13 compares the input signal with a threshold voltage $V_t$ connected to its negative terminal. If the input signal exceeds the threshold, the output of the comparator is a binary "1"; if the input signal is less than the threshold, the output of the comparator is a binary "0". The output of comparator 13, which is a serial digital representation of the analog input signal, is applied to shift register 14, which accumulates the successive bits of the digital representation in parallel form, and to selector 18. Shift register 14 is not needed if a serial digital representation is sufficient.

The signal stored in sample-and-hold circuit 15 is multiplied by a constant (two) in multiplier 16 and applied to the positive terminal of subtracter 17 and a signal from selector 18 is connected to the negative terminal of subtracter 17. Selector 18 determines such signal in accordance with the last-received bit from comparator 13. If the last-received bit is a "1", indicating that the input signal exceeded threshold $V_t$, then selector 18 supplies a first signal to subtracter 17. If the last-received bit is a "0", indicating that the input signal did not exceed the threshold, then selector 18 applies a second signal to subtracter 17. In an embodiment as shown in FIG. 1, if $V_t=0$, typically the first signal is a negative voltage and the second signal is a positive voltage.

To generate the remaining bits of the digital representation, switch 11 is moved to connect the output of subtracter 17 to the input of comparator 14 and the above-described comparison, subtraction and multiplication steps are performed repeatedly on the residue from sutracter 17 until the desired number of bits is obtained.

It should be noted that the operation of the A/D converter of FIG. 1 occurs in two phases, a first phase P1 during which the result of the subtraction (or the input signal during the first cycle) are applied to comparator 13 and sample-and-hold circuit 15 and a second phase P2 during which inputs are applied to subtracter 17. During P2, comparator 13 is idle.

As is well known in the art, there are a number of variations possible in choosing the threshold $V_t$ for comparator 13 and the related signals to be applied to subtracter 17 by selector 18. For example, if the input analog signal is bipolar and has a total swing of $V_r$, $V_t$ can be zero (ground), and the magnitudes of the signals applied by selector 18 can be $+V_r/2$ or $-V_r/2$ and the first bit converted will signify the polarity of such signal. If the input signal is always positive and has a total swing of $V_r$, $V_t$ can be $V_r/2$ and the magnitudes of the signals applied by selector 18 can be $V_r$ or 0. There are also variations known in the art in which the multiplier and the subtracter of the circuit of FIG. 1 are interchanged.

Figure 2:
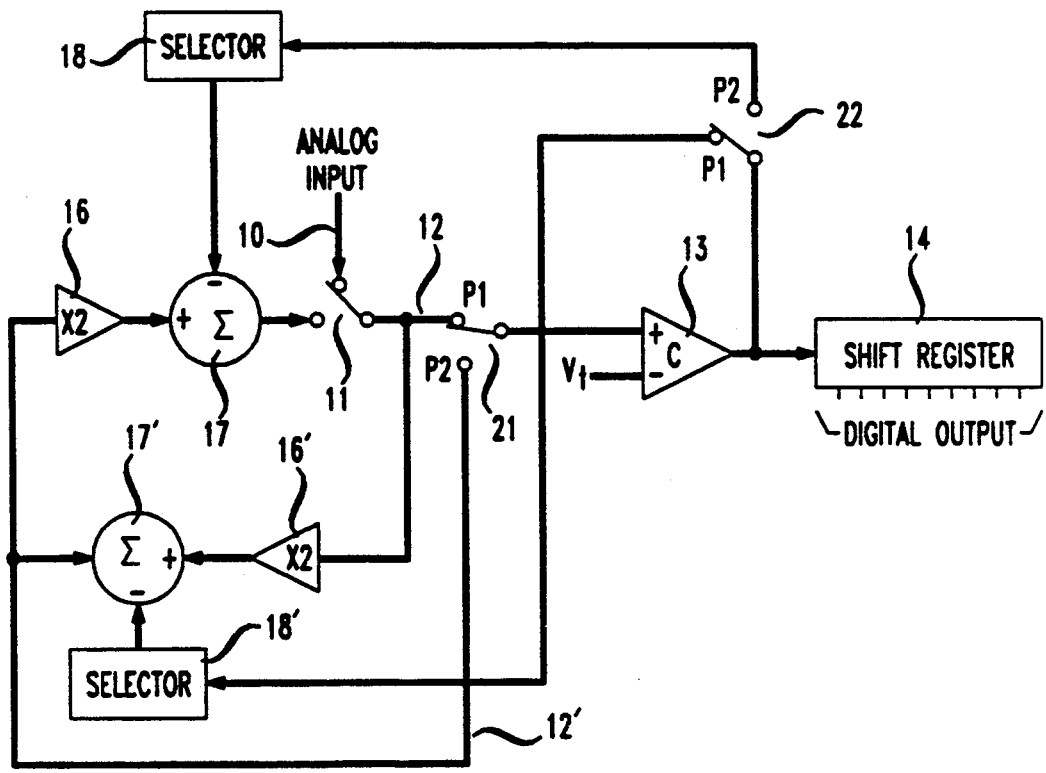
FIG. 2 is a block diagram of an algorithmic A/D converter constructed in accordance with the invention.

FIG. 2 shows an algorithmic A/D converter in accordance with the present invention. Referring to FIG. 2, sample-and-hold circuit 15 of FIG. 1 is replaced with a second multiplier 16′, a second subtracter 17′ and a second selector 18′. Comparator 13 is shared through switches 21 and 22 so that during P1 comparator 13 compares the signal on lead 12 with threshold $V_t$ and sets selector 18′ and during P2 compares the signal on lead 12′ with threshold $V_t$ and sets selector 18. The converter of FIG. 2 performs a full comparison, subtraction and multiplication cycle during both P1 and P2. Thus, given equivalent clock rates, the converter of FIG. 2 operates at twice the speed of the converter of FIG. 1.

Figure 3:
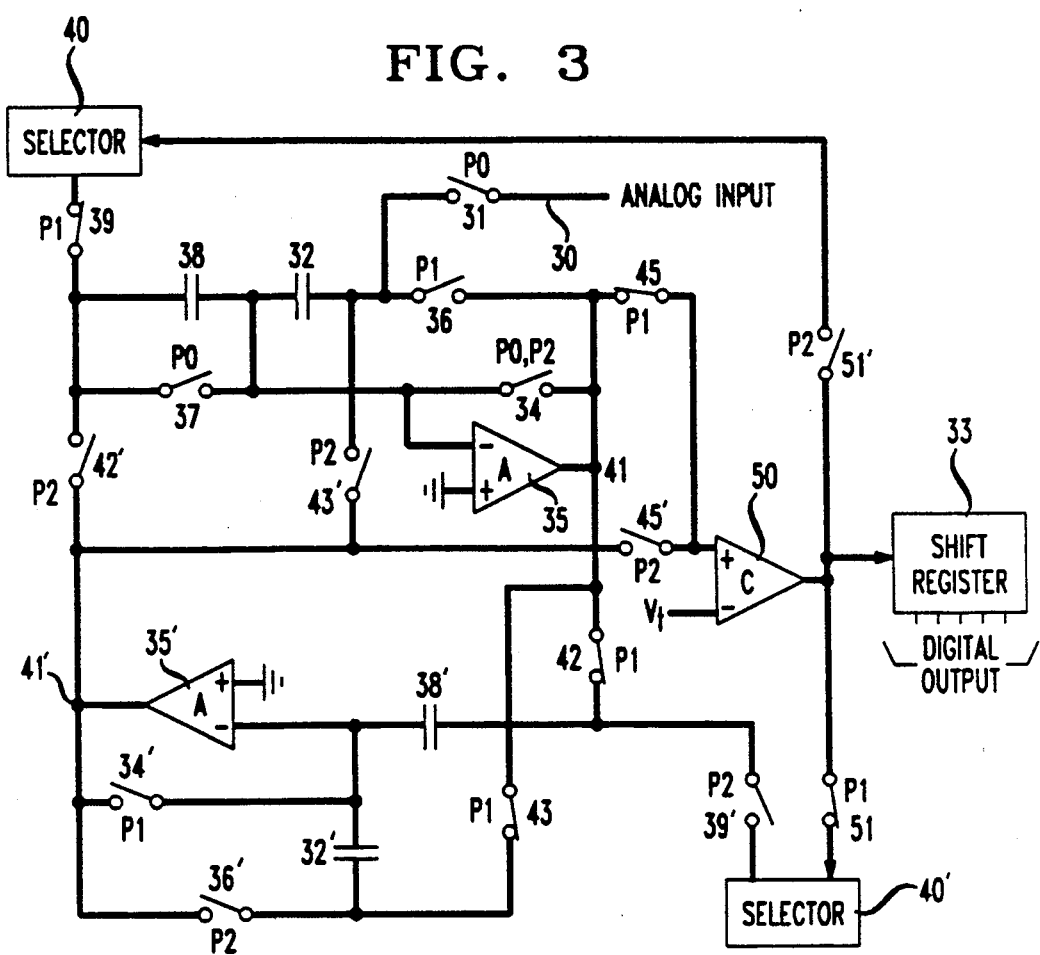
FIG. 3 is a schematic diagram of a switched-capacitor algorithmic A/D converter constructed in accordance with the invention using two operational amplifiers.

FIG. 3 shows an embodiment of the present invention using dual operational amplifiers, a single comparator and switched capacitors for storage of analog signal samples. The various switches, such as switch 31, shown in FIG. 3 can be MOS field-effect transistors, as is well known in the art. Such switches are selectively closed by a clock circuit (not shown) during the phases P0, P1 or P2 indicated for each switch. Such phases must be nonoverlapping. P0 is an initial phase during which the analog input signal to be converted is sampled onto capacitor 32. After P0 occurs, P1 and P2 are repeated until the desired number of bits is generated in shift register 33. The switches in FIG. 3 are shown in the open and closed positions that occur during P1.

During P0, the input signal on lead 30 passes through switch 31 to a first terminal of capacitor 32. Switch 34 across operational amplifier 35 is also closed during P0, which effectively grounds the negative input terminal of amplifier 35 and the second terminal of capacitor 32. Capacitor 32 thus charges to the magnitude of the input signal. Switch 37 also closes during P0 to keep capacitor 38 discharged.

Next, during P1, switch 34 opens and switch 36 closes, connecting capacitor 32 between the negative input terminal and the output terminal of operational amplifier 35, and switch 39 closes, placing the output of selector 40 on one terminal of capacitor 38. Thus, during P1, the output signal of amplifier 35 at node 41 stabilizes to become the algebraic sum of the output of selector 40, the voltage across capacitor 38 and the voltage across capacitor 32. During the first P1 after P0, the output of selector 40 and the voltage across capacitor 38 can both be assumed to be zero. Thus, during such first P1, the voltage at node 41 becomes equal in magnitude to the analog input signal on lead 30.

During P1, node 41 is connected through switch 45 to the positive input terminal of comparator 50. The output of comparator 50 will be "1" if the voltage at node 41 exceeds threshold $V_t$ during P1 and "0" if the voltage at node 41 does not exceed such threshold. Selector 40′ becomes set via switch 51 to provide a signal during P2 in accordance with the bit generated during P1.

Switches 34′, 42 and 43 are also closed during P1, thereby connecting both capacitors 32′ and 38′ between node 41 and effective ground at the negative input terminal of amplifier 35′. Thus, capacitors 32′ and 38′ each charge to the voltage at node 41. Capacitors 32′ and 38′ are arranged to be equal in value, as are capacitors 32 and 38.

During P2, when switches 34′, 42 and 43 open and switches 36′ and 39′ close, the voltage at node 41′ becomes the algebraic sum of the output of selector 40′ and the voltages across capacitors 32′ and 38′. Because capacitors 32′ and 38′ are of equal value, this switching of capacitors 32′ and 38′ doubles the voltage at node 41 by adding such voltage to itself. The output of selector 40′ is subtracted by algebraic addition. That is, if it is desired to subtract a positive voltage of a given magnitude, the output of selector 40′ is chosen to be a negative voltage of such magnitude.

Also during P2, the voltage at node 41′ is applied through switch 45′ to comparator 50 and through switches 42′ and 43′ to capacitors 38 and 32. Comparator 50 then sets selector 40 through switch 51′ and capacitors 38 and 32 become charged in readiness for the next P1. The contents of shift register 33 are shifted to the right one position after P0 and each P1 and P2 by a signal from the clock (not shown) to accumulate the desired digital representation of the analog input signal. P1 and P2 are repeated until the required number of bits is obtained.

Figure 4:
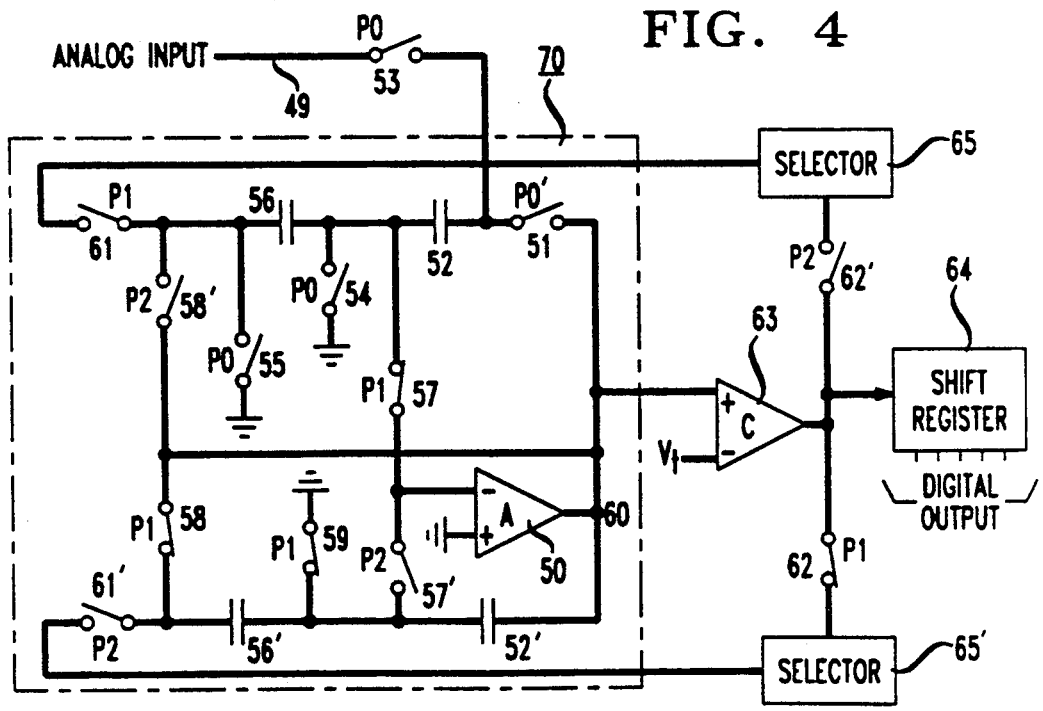
FIG. 4 is a schematic diagram of a switched-capacitor algorithmic A/D converter constructed in accordance with the invention using a single operational amplifier.

FIG. 4 shows an alternate embodiment of an A/D converter in accordance with the present invention using only a single operational amplifier 50. The converter of FIG. 4 operates in a similar manner to that of FIG. 3. Again, the various switches are marked to show the phases P0, P1 or P2 during which they are closed and the switches are shown in their P1 conditions. Switch 51 is marked P0′ to indicate that it is open during P0 and closed otherwise.

During P0, the analog input signal to be converted on lead 49 is connected to a first terminal of capacitor 52 through switch 53. The second terminal of capacitor 52 is grounded through switch 54 so that capacitor 52 charges to the magnitude of the input signal. During P0, switch 55 is closed and capacitor 56 remains discharged.

During the first P1, capacitor 52 is connected across amplifier 50 by the closing of switches 51 and 57 and the voltage at node 60 becomes equal to that on lead 49. Switch 61 also closes, but the output of selector 65′ can be assumed to be zero during the first P1, and has no effect on the node 60 voltage. Switches 58 and 59 also close, charging capacitors 52′ and 56′ to the voltage at node 60. Selector 65′ is set by comparator 63 through switch 62 in preparation for P2. Again, successive outputs from comparator 63 are assembled in shift register 64 to give the digital representation of the analog input signal on lead 49.

During P2, when the switches marked P1 open and the switches marked P2 close, the voltage at node 60 becomes the sum of the output of selector 65′ and the voltages across capacitors 52′ and 56′, capacitors 52 and 56 charge to the voltage at node 60, and selector 65 becomes set by comparator 63 through switch 62′ in preparation for the next P1. As with the circuit in FIG. 3, P1 and P2 are repeated until the desired number of bits is accumulated in shift register 64. Again the clock signals to the various switches and to shift register 64 are generated by a clock circuit (not shown) and must be non-overlapping.

Figure 5:
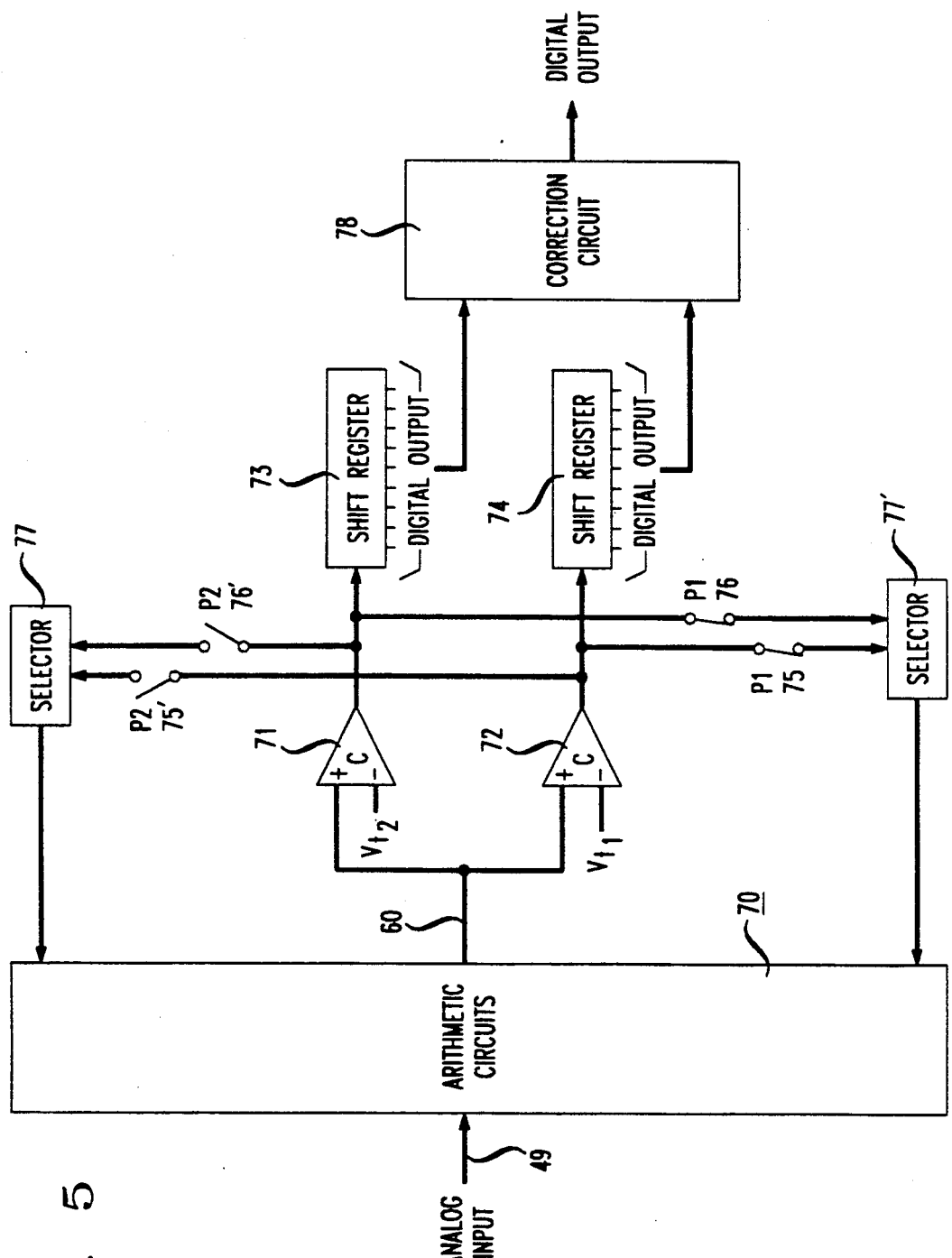
FIG. 5 is a schematic diagram of a switched-capacitor algorithmic converter constructed in accordance with the invention and having three comparator levels for use with digital correction.

FIG. 5 shows an A/D converter in accordance with the invention and arranged for digital correction, which is described more fully in U.S. Pat. No. 5,017,920 mentioned previously. Arithmetic circuits 70 inside the dotted lines are is identical to the corresponding arithmetic circuits 70 shown in FIG. 4. In the converter of FIG. 5, the voltage on node 60 is applied to input terminals of both comparators 71 and 72. Typically, $V_{t2}$ is more positive than $V_{t1}$.

If the voltage on node 60 is below $V_{t1}$, then the outputs of both comparators 71 and 72 will be low or "0". If the voltage on node 60 is between $V_{t1}$ and $V_{t2}$, then the output of comparator 72 will be "1" and that of comparator 71 will be "0". If the node 60 voltage is above $V_{t2}$, then the output of both comparators will be "1". Thus, the combined outputs of converters 71 and 72 give a three-state indication ("00", "10" or "11") of the magnitude of the voltage on node 60. Such three-state indication is applied to shift registers 73 and 74 and through switches 75, 75', 76 and 76' to selectors 77 and 77' in a manner comparable to the application of the output of comparator 63 to shift register 64 and selectors 65 and 65' in FIG. 4. Selectors 77 and 77' apply three-state outputs to circuitry 70, for example +V, 0 and −V, in accordance with the indication received from the comparators. Again, the relationships between the range of the analog input signal, the thresholds $V_{t1}$ and $V_{t2}$ and the magnitudes of the outputs of selectors 77 and 77' are well known in the art.

The outputs from shift registers 73 and 74 are combined in correction circuit 78 to provide the digital output. Correction circuit 78 typically comprises digital adders and other logic. A description of one embodiment of such digital correction circuitry is included in U.S. Pat. No. 5,017,920.

The converters of FIGS. 3, 4 and 5 can also be implemented with differential operational amplifiers and comparators. Such a differential embodiment typically requires twice the number of switches and capacitors as a single-ended embodiment, but can provide increased accuracy, as is well known in the art. Examples of differential embodiments of prior-art A/D converters are shown in U.S. Pat. No. 5,027,116.

It would be apparent to those skilled in the art that other embodiments incorporating the principles of the present invention are possible. The above disclosure is merely illustrative and is not intended to be limiting in any respect.

I claim:

1. An analog-to-digital converter comprising
an operational amplifier
a comparator having an input connected to the output of said operational amplifier,
first and second selectors for producing values in response to output signals from said comparator,
first, second, third and fourth capacitors of equal value,
means operative during a phase P0 for charging said first capacitor to the value of the analog input signal to be converted and for keeping said second capacitor discharged,
means operative during a phase P1 for connecting said first capacitor between input and output terminals of said operational amplifier, connecting said second capacitor between the output terminal of said first selector and the input terminal of said operational amplifier, connecting the output of said comparator to the input of said second selector and charging said third and fourth capacitors to the value of the output of said operational amplifier and means operative during a phase P2 for connecting said third capacitor between the input and output terminals of said operational amplifier, connecting said fourth capacitor between the output terminal of said second selector and the input terminal of said operational amplifier, connecting the output of said comparator to the input of said first selector and charging said first and second capacitors to the value of the output of said operational amplifier clock means for generating timing signals defining phase P0 and repeated phases P1 and P2 to convert said analog input signal to a digital signal at the output terminal of said comparator.

2. An analog-to-digital converter comprising
an operational amplifier
a comparator having an input connected to the output of said operational amplifier,
first and second selectors for producing values in response to output signals from said comparator,
first and second capacitive storage means, each capacitive storage means including at least two capacitors,
means operative during a phase P0 for charging at least one capacitor in said first capacitive storage means in accordance with the value of the analog input signal to be converted,
means operative during a phase P1 for connecting the capacitors in the first capacitive storage means and the output of said first selector to said operational amplifier and connecting the output of said comparator to the input of said second selector so that the output of the operational amplifier becomes the algebraic sum of the output of said first selector and voltages across at least two of the capacitors in said first capacitive storage means and charging at least two capacitors in said second capacitive storage means in accordance with the value of the output of said operational amplifier and
means operative during a phase P2 for connecting the capacitors in the second capacitive storage means and the output of said second selector to said operational amplifier and connecting the output of said comparator to the input of said first selector so that the output of the operational amplifier becomes the algebraic sum of the output of said second selector and voltages across at least two of the capacitors in said second capacitive storage means and charging at least two capacitors in said first capacitive storage means in accordance with the value of the output of said operational amplifier and
clock means for generating timing signals defining phase P0 and repeated phases P1 and P2 to convert said analog input signal to a digital signal at the output terminal of said comparator.

3. An analog-to-digit converter comprising a comparator and means responsive to the output of said comparator for repeatedly modifying an analog signal being converted and presenting such modified signal to the input of said comparator, the digital output signal of said converter being produced from successive outputs from said comparator CHARACTERIZED IN THAT
said means for modifying comprises first and second analog arithmetic circuits, the input of said first arithmetic circuit being connected selectively to an analog input signal to be converted or to the output of said second arithmetic circuit, the input of said second arithmetic circuit being connected to the output of said first arithmetic circuit and means for connecting the outputs of said first and second arithmetic circuits alternately to the input of said comparator;

said first and second analog arithmetic circuits each comprises means for multiplying said analog signal being converted by a constant, means for selecting a value in accordance with an output signal from said comparator and means for algebraically combining said selected value with said analog signal being converted; and said first and second analog arithmetic circuits together comprise two sets of switched capacitors and a single shared operational amplifier.

4. An analog-to-digit converter comprising a comparator and means responsive to the output of said comparator for repeatedly modifying an analog signal being converted and presenting such modified signal to the input of said comparator, the digital output signal of said converter being produced from successive outputs from said comparator

CHARACTERIZED IN THAT said means for modifying comprises first and second analog arithmetic circuits, the input of said first arithmetic circuit being connected selectively to an analog input signal to be converted or to the output of said second arithmetic circuit, the input of said second arithmetic circuit being connected to the output of said first arithmetic circuit and means for connecting the outputs of said first and second arithmetic circuits alternately to the input of said comparator;

said first and second analog arithmetic circuits each comprise means for multiplying said analog signal being converted by a constant, means for selecting a value in accordance with an output signal from said comparator and means for algebraically combining said selected value with said analog signal being converted; and said comparator is adapted to compare said analog signal being converted with more than one reference value, each output signal from said comparator is a set of at least two bits, the means for selecting a value is adapted to select from more than two values and said analog-to-digit converter further comprises means for combining sets of bits from said comparator to produce said digital output signal.

5. A cyclic analog-to-digit converter comprising:

an operational amplifier;

a comparator connected to the output of said operational amplifier, the digital output signal from said converter being produced from successive output signals from said comparator;

means for selecting a value in accordance with the output signal from said comparator;

first and second sets of capacitors, means for connecting said first set of capacitors and said operational amplifier into a first analog arithmetic circuit during first phases and said second set of capacitors and said operational amplifier into a second analog arithmetic circuit during second phases, the input of said first arithmetic circuit being connected selectively to an analog input signal to be converted or to the output of said operational amplifier, the input of said second arithmetic circuit being connected to the output of said operational amplifier, said first and second analog arithmetic circuits being configured to multiply said analog signal by a constant and to algebraically combine said selected value with said analog signal being converted.

* * * * *